(12) United States Patent
Nagai

(10) Patent No.: US 7,999,301 B2
(45) Date of Patent: Aug. 16, 2011

(54) SEMICONDUCTOR DEVICE AND METHOD OF MANUFACTURING THE SAME

(75) Inventor: Kouichi Nagai, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 541 days.

(21) Appl. No.: 11/545,534

(22) Filed: Oct. 11, 2006

(65) Prior Publication Data

US 2008/0217668 A1 Sep. 11, 2008

Related U.S. Application Data

(63) Continuation of application No. PCT/JP2004/006289, filed on Apr. 30, 2004.

(51) Int. Cl.
*H01L 29/92* (2006.01)
(52) U.S. Cl. .................. 257/306; 257/E29.342
(58) Field of Classification Search .................. 257/295, 257/E29.342, E21.008, 306, 748, 760, 532; 438/3
See application file for complete search history.

(56) References Cited

U.S. PATENT DOCUMENTS

| | | | |
|---|---|---|---|
| 6,218,197 B1 | 4/2001 | Kasai | |
| 6,465,826 B2 | 10/2002 | Kasai | |
| 6,611,014 B1 | 8/2003 | Kanaya et al. | |
| 6,982,453 B2 | 1/2006 | Kanaya et al. | |
| 2002/0020868 A1* | 2/2002 | Yang et al. | 257/303 |
| 2003/0030117 A1 | 2/2003 | Iwasaki et al. | |
| 2003/0071293 A1 | 4/2003 | Otani et al. | |
| 2004/0046185 A1* | 3/2004 | Sashida | 257/200 |

FOREIGN PATENT DOCUMENTS

| | | |
|---|---|---|
| JP | 2001/358309 A | 12/2001 |
| JP | 2002-217198 A | 8/2002 |
| JP | 2002/353442 A | 12/2002 |
| JP | 2003/068993 A | 3/2003 |
| JP | 2003/197878 A | 7/2003 |
| JP | 2004/095861 A | 3/2004 |

OTHER PUBLICATIONS

International Search Report of PCT/JP2004/006289, date of mailing Aug. 10, 2004.
Notification of Transmittal of Translation of the International Preliminary Report on Patentability (Form PCT/IB/338) of International Application No. PCT/JP2004/006289 mailed Nov. 9, 2006 with Forms PCT/IB/373 and PCT/ISA/237.
Chinese Office Action dated Jun. 13, 2008 (mailing date), issued in corresponding Chinese Patent Application No. 200480042133.X.
Chinese Office Action dated Jan. 16, 2009, issued in corresponding Chinese Patent Application No. 200480042133.X.

* cited by examiner

*Primary Examiner* — Thomas L Dickey
*Assistant Examiner* — Fazli Erdem
(74) *Attorney, Agent, or Firm* — Westerman, Hattori, Daniels & Adrian, LLP

(57) ABSTRACT

After a ferroelectric capacitor (1) is formed and before a wiring (15) to be a pad is formed, an alumina film (11) is formed as a diffusion suppressing film suppressing diffusion of hydrogen and moisture. Subsequently, the wiring (15) is formed and an SOG film (16) is formed thereon. Then, a silicon nitride film (17) is formed on the SOG film (16).

9 Claims, 19 Drawing Sheets
(3 of 19 Drawing Sheet(s) Filed in Color)

RELATED ART FIG. 6

SEMICONDUCTOR DEVICE AND METHOD OF MANUFACTURING THE SAME

This application is a continuation of international application PCT/JP2004/006289 filed on Aug. 30, 2004.

TECHNICAL FIELD

The present invention relates to a semiconductor device suitable for a non-volatile memory with a ferroelectric capacitor and a method of manufacturing the same.

BACKGROUND ART

On top of a ferroelectric memory, a pad is provided to which a wiring or the like is connected from the outside. FIG. 6 is a cross-sectional view showing a structure of a conventional ferroelectric memory.

In the conventional ferroelectric memory, a transistor (not shown) is formed on a silicon substrate (not shown), and an interlayer insulation film 52 is formed above them. On the interlayer insulation film 52, a ferroelectric capacitor 51 is formed which includes a bottom electrode 51a, a ferroelectric film 51b, and a top electrode 51c. An interlayer insulation film 53 covering the ferroelectric capacitor 51 is formed on the interlayer insulation film 52. A hole reaching the transistor and the like is formed in the interlayer insulation films 52 and 53, and a plug 54 is formed in the hole. Further, holes reaching the top electrode 51a and the bottom electrode 51c are also formed in the interlayer insulation film 53, and wirings 55 are formed in the holes and on the plug 54. An alumina film 56 covering the wirings 55 is formed, and an interlayer insulation film 57 is formed on the alumina film 56. A hole reaching the wiring 55 is formed in the alumina film 56 and the interlayer insulation film 57, and a plug 58 is formed in the hole. On the interlayer insulation film 57, wirings 59 are formed. An interlayer insulation film 60 covering the wirings 59 is formed on the interlayer insulation film 57. Holes reaching the wirings 59 are formed in the interlayer insulation film 60, and plugs 64 are formed in the holes.

On the interlayer insulation film 60, wirings 65 are formed which also serve as pads. A silicon oxide film 66 and a silicon nitride film 67 are formed which cover the wirings 65. The thicknesses of the silicon oxide film 66 and the silicon nitride film 67 are about 100 nm and about 350 nm, respectively. A pad opening 68 exposing a portion of the wiring 65 is formed in the silicon oxide film 66 and the silicon nitride film 67. On the silicon nitride film 67, a polyimide film 70 is formed. The silicon oxide film 66 is formed using TEOS (tetraethylorthosilicate) or the like.

The silicon nitride film 67 having a larger thickness can suppress entry of hydrogen and moisture from the outside more. However, a gas containing H (hydrogen) is used at the time of forming the silicon nitride film 67, and therefore if the silicon nitride film 67 is formed thick, hydrogen adversely affecting the ferroelectric film 51b will enter the inside at the time of formation thereof. In consideration of these circumstances, the thickness of the silicon nitride film 67 is set to about 350 nm in the conventional ferroelectric memory.

However, in the combination of the silicon oxide film 66 of about 100 nm and the silicon nitride film 67 of about 350 nm, cracks may occur in the silicon nitride film 67 during use or the like to allow hydrogen, moisture and the like to enter the inside. If such entry occurs, PTHS (Pressure Temperature Humidity Stress) defects and/or single-bit defects may be induced. The causes of such cracks include a low flatness of the silicon nitride film 67. Making the silicon oxide film 66 thick can improve the flatness of the silicon nitride film 67. However, if a thick silicon oxide film 66 is formed using TEOS, a large amount of moisture in the silicon oxide film 66 can diffuse down to the ferroelectric capacitor during the subsequent heating process and the like.

For such situation, a thick SOG (Spin On Glass) film may be used as a silicon oxide film constituting the covering film in a semiconductor device having no ferroelectric capacitor such as a DRAM (Dynamic random Access Memory) or the like.

However, the SOG film cannot be applied to the ferroelectric memory. This is because it is necessary to perform thermal processing at a high temperature in order to form the SOG film, and a large amount of hydrogen and moisture diffuses during the thermal processing. In addition, the SOG film itself has a high hygroscopicity so that the moisture absorbed by the SOG film after formation can diffuse down to the ferroelectric capacitor afterward.

Patent Document 1
Japanese Patent Application Laid-open No. 2001-36026
Patent Document 2
Japanese Patent Application Laid-open No. 2001-15703

SUMMARY OF THE INVENTION

An object of the present invention is to provide a semiconductor device and a method of manufacturing the same each capable of suppressing adverse effect from an upper layer and the outside onto a ferroelectric capacitor.

After keen examination to solve the above problems, the present inventor has reached various aspects of the invention shown below.

A semiconductor device according to the present invention includes a ferroelectric capacitor, two or more wiring layers formed above the ferroelectric capacitor, and a substantially flat alumina film formed between two wiring layers located at an uppermost portion of the two or more wiring layers.

In a method of manufacturing a semiconductor device according to the present invention, a ferroelectric capacitor is formed, and two or more wiring layers are then formed above the ferroelectric capacitor. During the step of forming two or more wiring layers, a substantially flat alumina film is formed between two wiring layers located at an uppermost portion of the two or more wiring layers.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 2A to 2I are cross-sectional views showing a method of manufacturing a ferroelectric memory according to a first embodiment of the present invention in the order of steps;

DETAILED DESCRIPTION OF THE PREFERRED EMBODIMENTS

Figure 1:
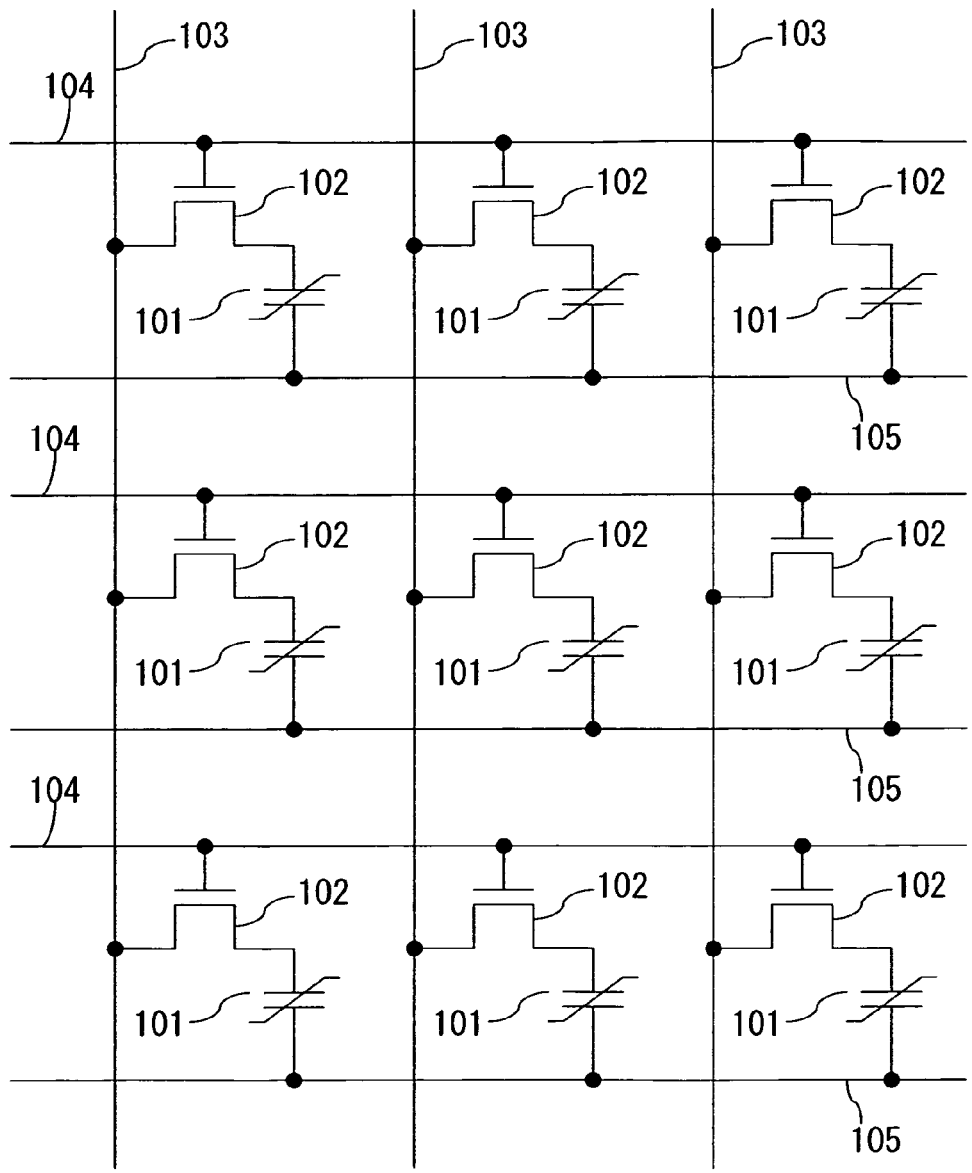
FIG. 1 is a circuit diagram showing a configuration of a memory cell array of a ferroelectric memory (semiconductor device) to be manufactured by a method according to an embodiment of the present invention.

Hereinafter, embodiments of the present invention will be described with reference to the accompanying drawings. FIG. 1 is a circuit diagram showing a configuration of a memory cell array of a ferroelectric memory (semiconductor device) to be manufactured by a method according to an embodiment of the present invention.

In this memory cell array, a plurality of bit lines 103 extending in one direction and a plurality of word lines 104 and plate lines 105 are provided both extending in a direction perpendicular to the direction in which the bit lines 103 extend. Further, a plurality of memory cells of a ferroelectric memory are arranged in an array form in a manner to coincide with the lattice formed by the bit lines 103, the word lines 104, and the plate lines 105. In each of the memory cells, a ferroelectric capacitor 101 and a MOS transistor 102 are provided.

The gate of the MOS transistor 102 is connected to the word line 104. Besides, one source/drain of the MOS transistor 102 is connected to the bit line 103, and the other source/drain is connected to one electrode of the ferroelectric capacitor 101. Further, the other electrode of the ferroelectric capacitor 101 is connected to the plate line 105. Note that each of the word lines 104 and the plate lines 105 is commonly used among the plurality of MOS transistors 102 arranged side by side in the same direction as the direction in which the word line 104 and the plate line 105 extend. Similarly, each of the bit lines 103 is commonly used among the plurality of MOS transistors 102 arranged side by side in the same direction as the direction in which the bit line 103 extends. The direction in which the word line 104 and the plate line 105 extend and the direction in which the bit line 103 extends may be referred to as a row direction and a column direction, respectively. It should be noted that the arrangement of the bit lines 103, the word lines 104, and the plate lines 105 is not limited to the above-described one.

In the memory cell array of the ferroelectric memory thus configured, data is stored depending on the polarization status of a ferroelectric film provided in the ferroelectric capacitor 101.

Next, various embodiments of the present invention will be described. It should be noted that the cross-sectional structure of each memory cell of the ferroelectric memory will be described herein together with the manufacturing method thereof for convenience.

First Embodiment

First, a method of manufacturing a ferroelectric memory (semiconductor device) according to a first embodiment of the present invention will be described. FIG. 2A to FIG. 2I are cross-sectional views showing the method of manufacturing a ferroelectric memory according to the first embodiment of the present invention in the order of steps.

Figure 2A:
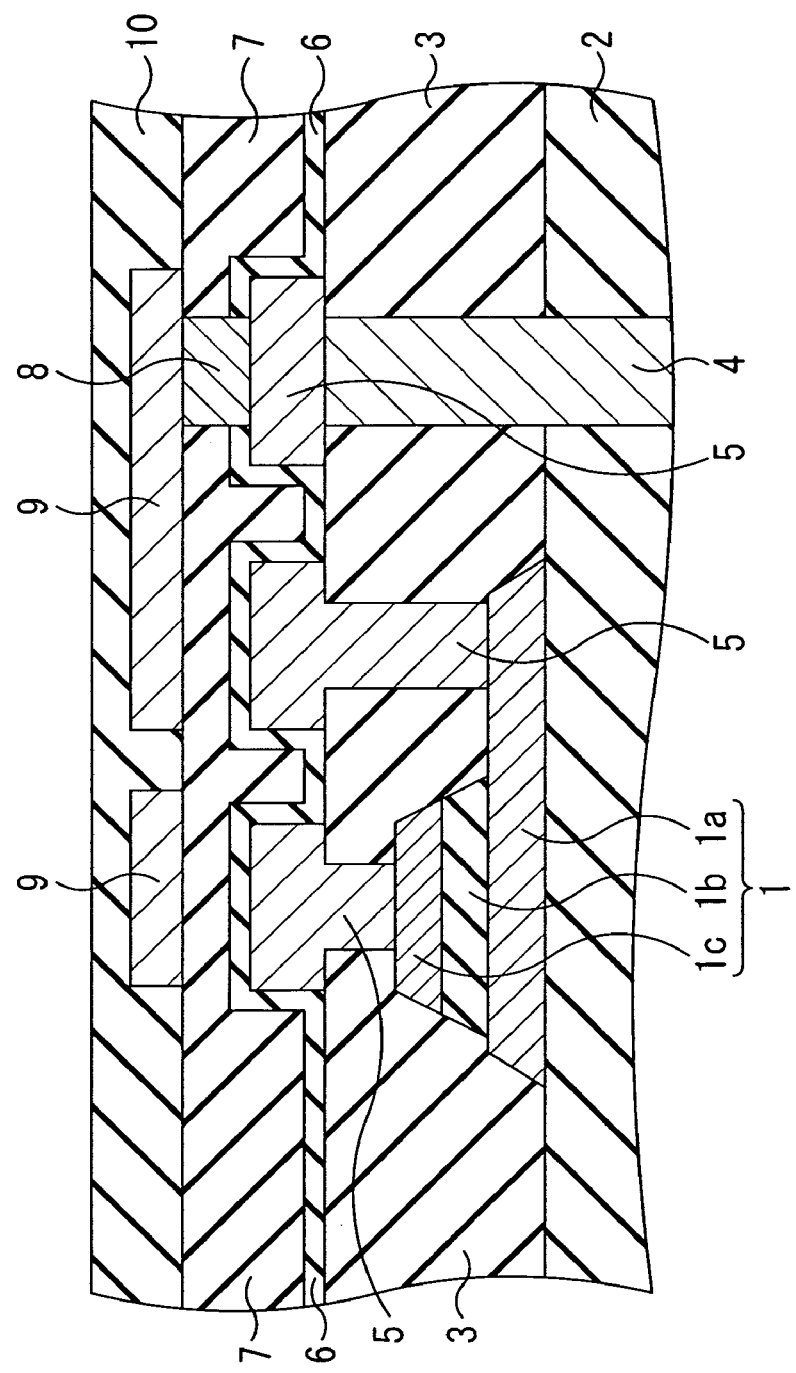

In this embodiment, transistors (not shown) are formed on a semiconductor substrate (not shown) such as a silicon substrate. The transistors correspond to the MOS transistors 102 in FIG. 1. Next, above them, an interlayer insulation film 2 is formed as shown in FIG. 2A. Subsequently, on the interlayer insulation film 2, ferroelectric capacitors 1 are formed each of which includes a bottom electrode 1a, a ferroelectric film (for example, PZT (Pb(Zr, Ti)$O_3$) film) 1b, and a top electrode 1c. Thereafter, an interlayer insulation film 3 covering the ferroelectric capacitors 1 is formed on the interlayer insulation film 2.

Subsequently, holes reaching the transistors or the like are formed in the interlayer insulation films 2 and 3, and plugs 4 are formed in the holes. Then, holes reaching the top electrode 1a and the bottom electrode 1c are formed in the interlayer insulation film 3. Then, wirings 5 are formed in the holes and on the plugs 4.

Thereafter, an alumina film 6 covering the wirings 5 is formed, and an interlayer insulation film 7 is formed on the alumina film 6. Subsequently, holes reaching the wirings 5 are formed in the alumina film 6 and the interlayer insulation film 7, and plugs 8 are formed in the holes. Next, wirings 9 are formed on the interlayer insulation film 7. An interlayer insulation film 10 covering the wirings 9 are formed on the interlayer insulation film 7.

Figure 2B:
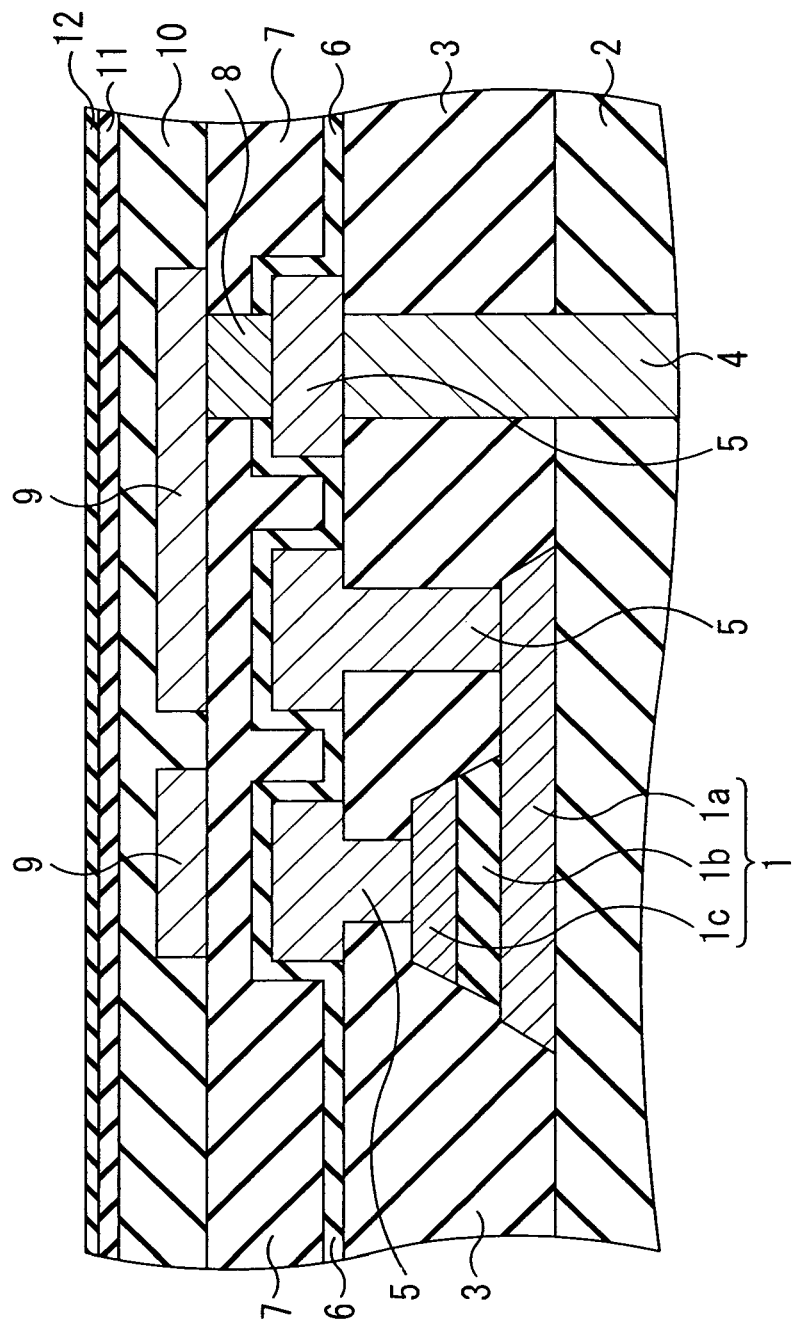

Subsequently, as shown in FIG. 2B, a substantially flat alumina film 11 is formed as a diffusion suppressing film suppressing diffusion of hydrogen and moisture. The thickness of the alumina film 11 is set to, for example, 70 nm. Further, an interlayer insulation film 12 is formed on the alumina film 11.

Figure 2C:
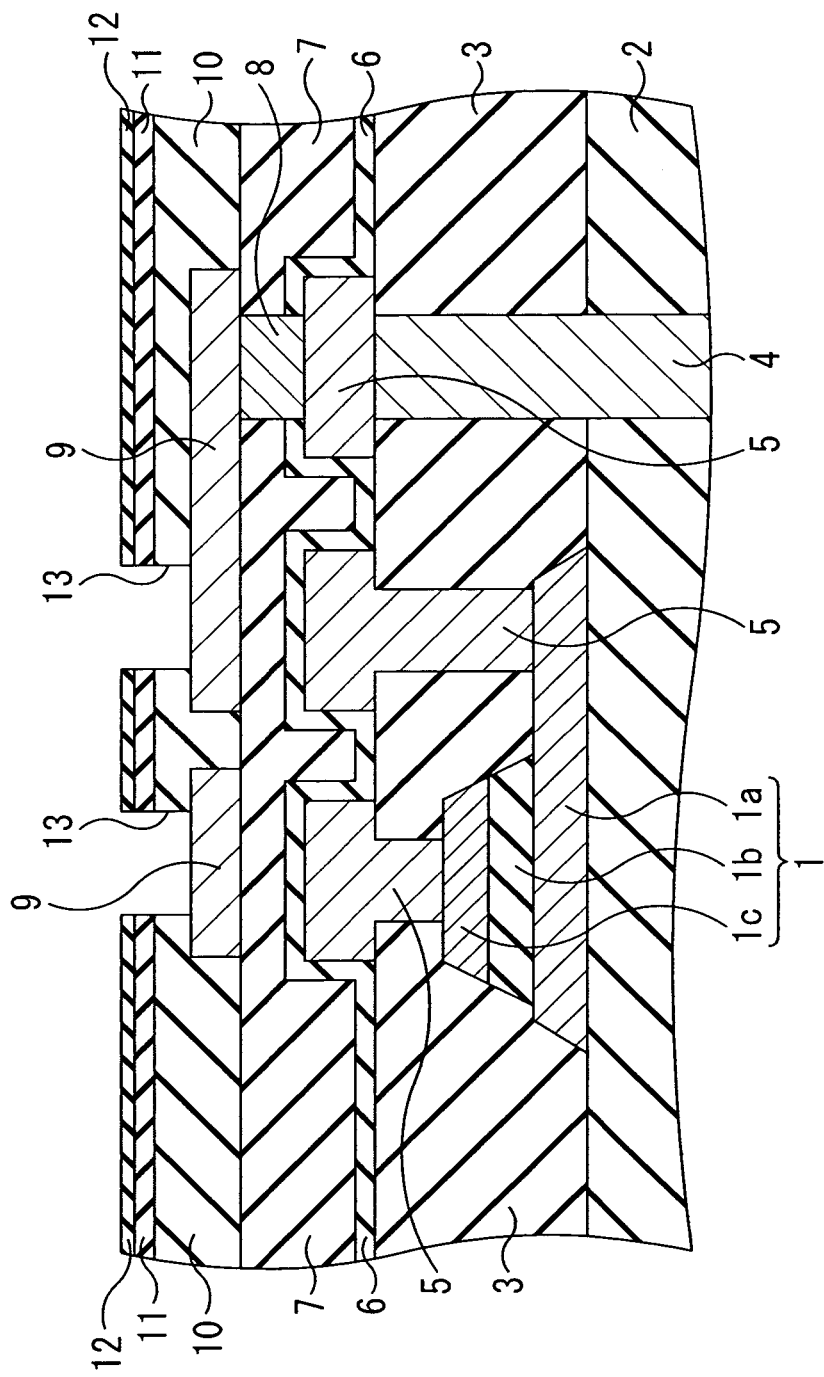

Thereafter, as shown in FIG. 2C, holes 13 reaching the wirings 9 are formed in the interlayer insulation film 10, the alumina film 11, and the interlayer insulation film 12.

Figure 2D:
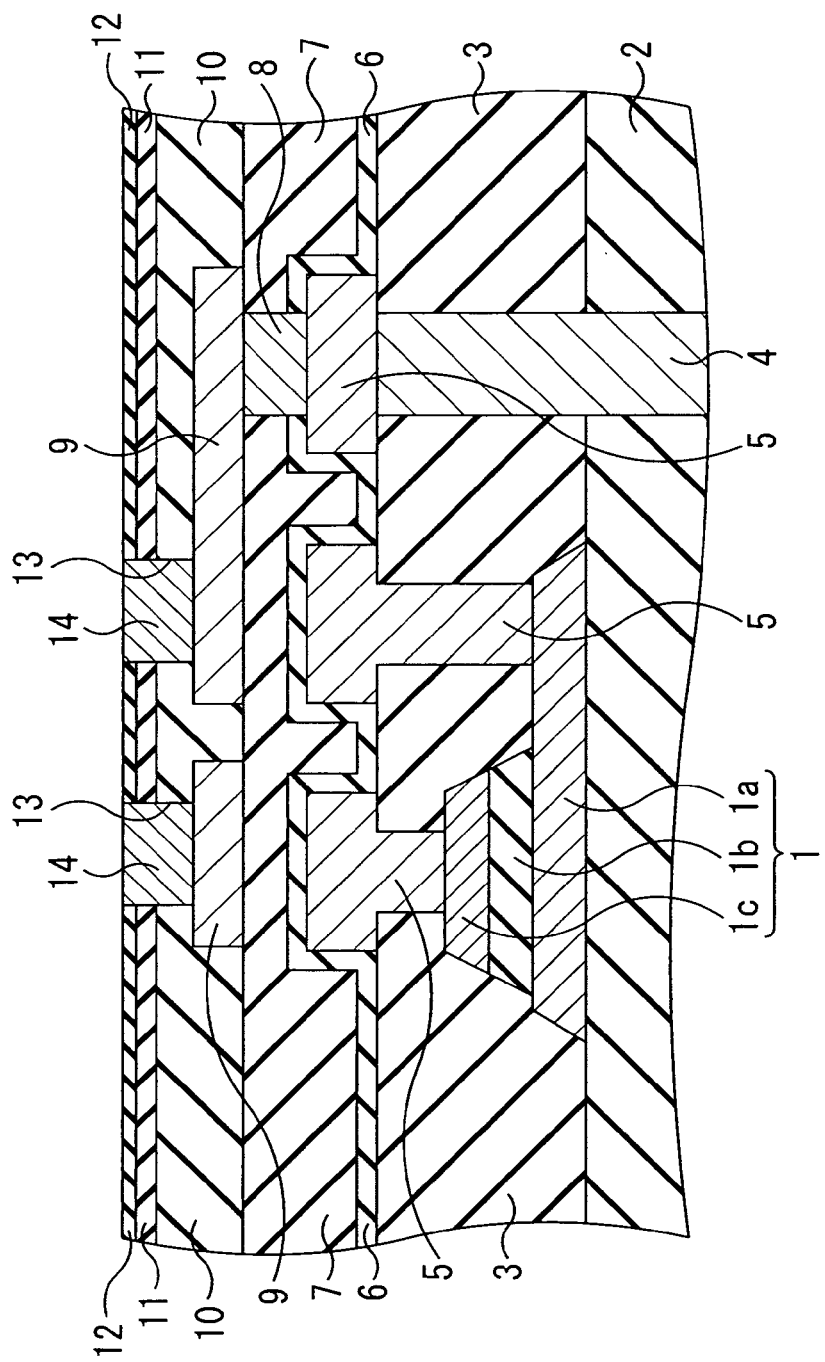

Subsequently, as shown in FIG. 2D, plugs 14 are formed in the holes 13.

Figure 2E:
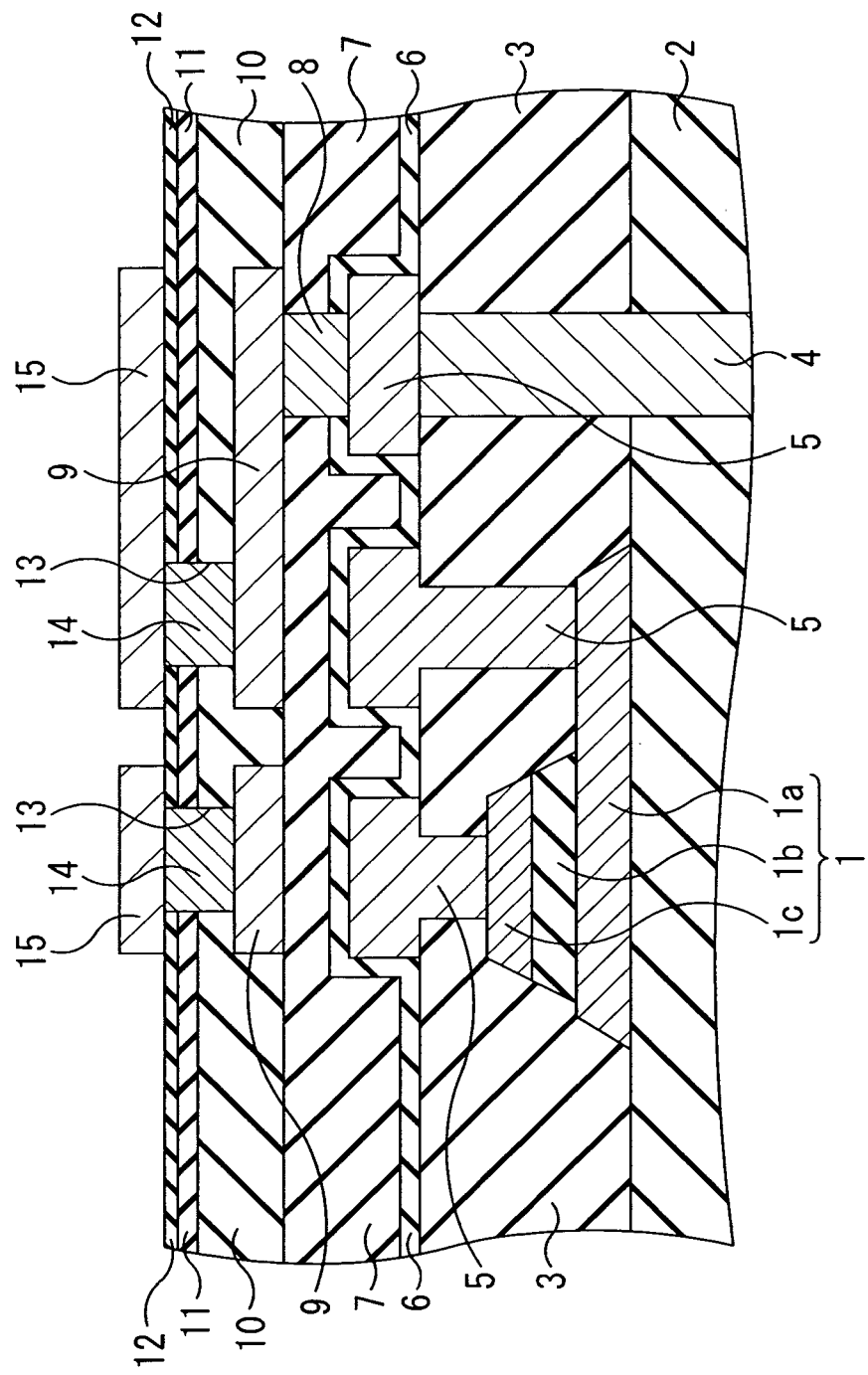

Next, as shown in FIG. 2E, wirings 15 connected to the plugs 14 are formed on the interlayer insulation film 12. Note that CMP may be performed prior to the formation of the wirings 15 to flatten the interlayer insulation film 12.

Figure 2F:
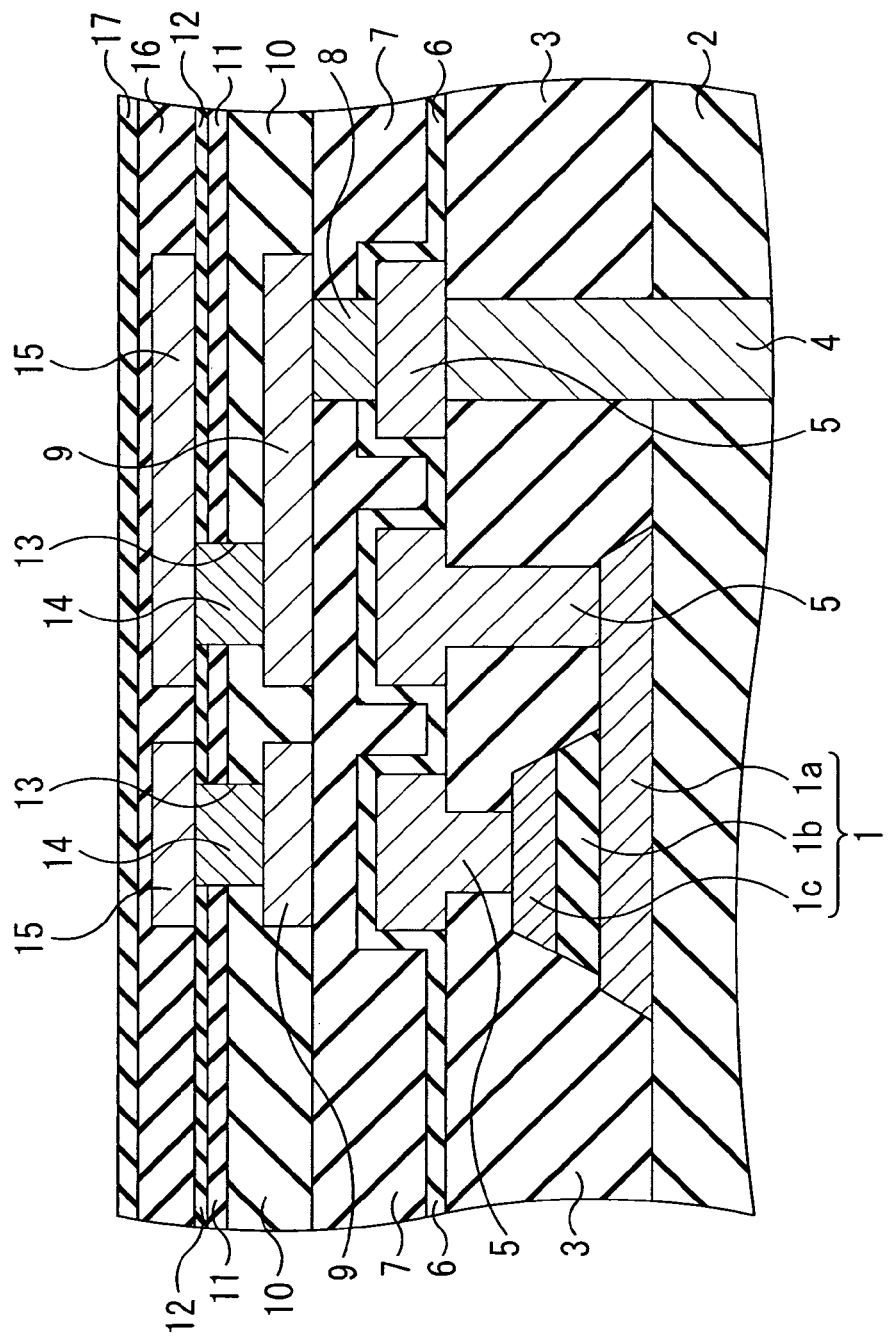

Subsequently, as shown in FIG. 2F, a coating-type SOG film 16 is formed on the entire surface. Thereafter, plasma processing is performed on the SOG film 16 in an atmosphere containing N (nitrogen). As a result of this, the surface of the SOG film 16 is slightly nitrided and thus decreases in hygroscopicity. Furthermore, a silicon nitride film 17 is formed on the SOG film 16. The thickness of the SOG film 16 is set to, for example, about 350 nm and the thickness of the silicon nitride film 17 is set to, for example, 350 nm to 500 nm. Since the flatness of the coating-type SOG film 16 is relatively high, the flatness of the silicon nitride film 17 also becomes relatively high, hardly causing cracks in the silicon nitride film 17.

Figure 2G:
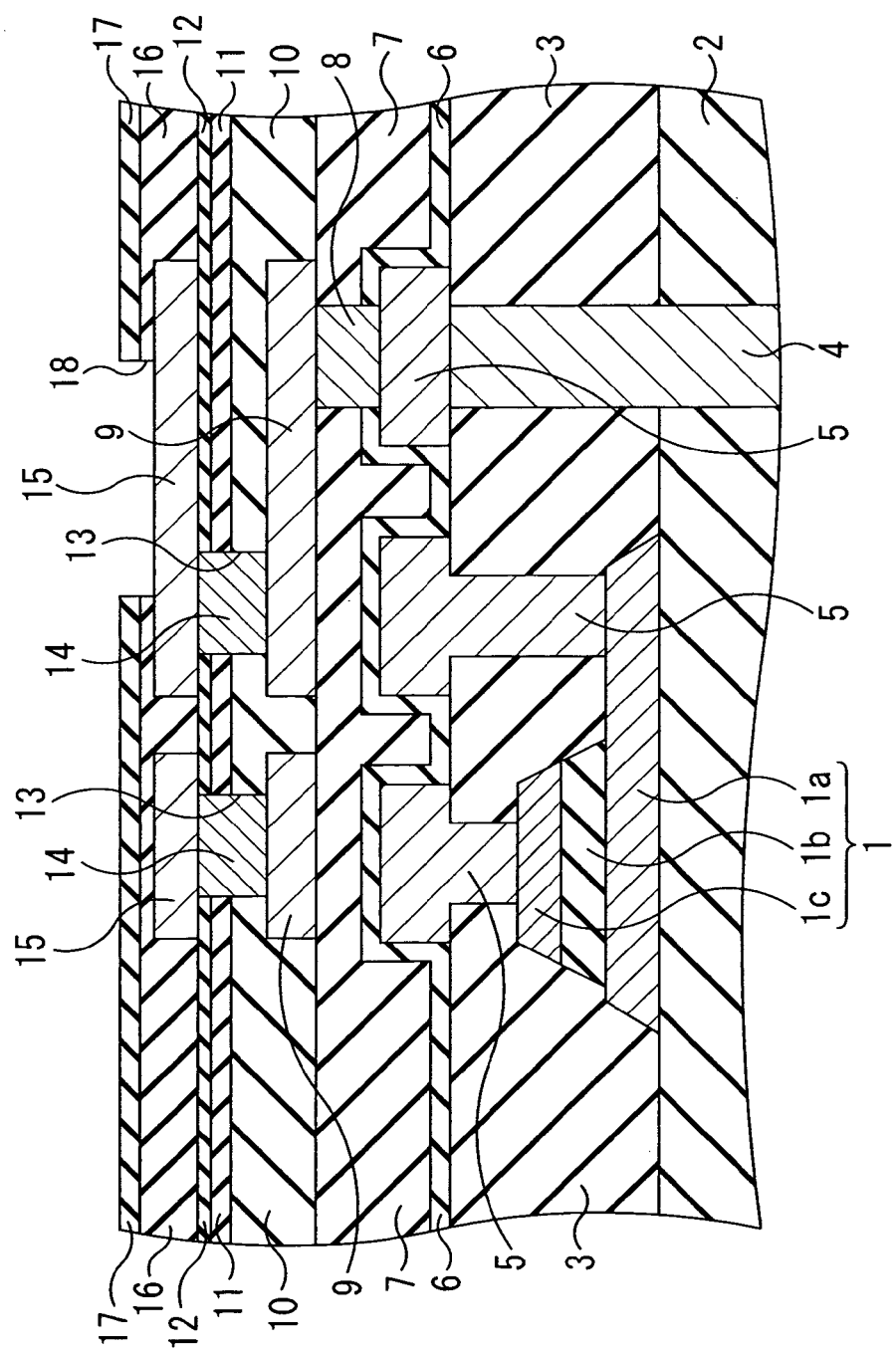

Subsequently, as shown in FIG. 2G, pad openings 18 each of which expose a portion of the wiring 15 are formed in the SOG film 16 and the silicon nitride film 17. The exposed portion of the wiring 15 will be a pad.

Figure 2H:
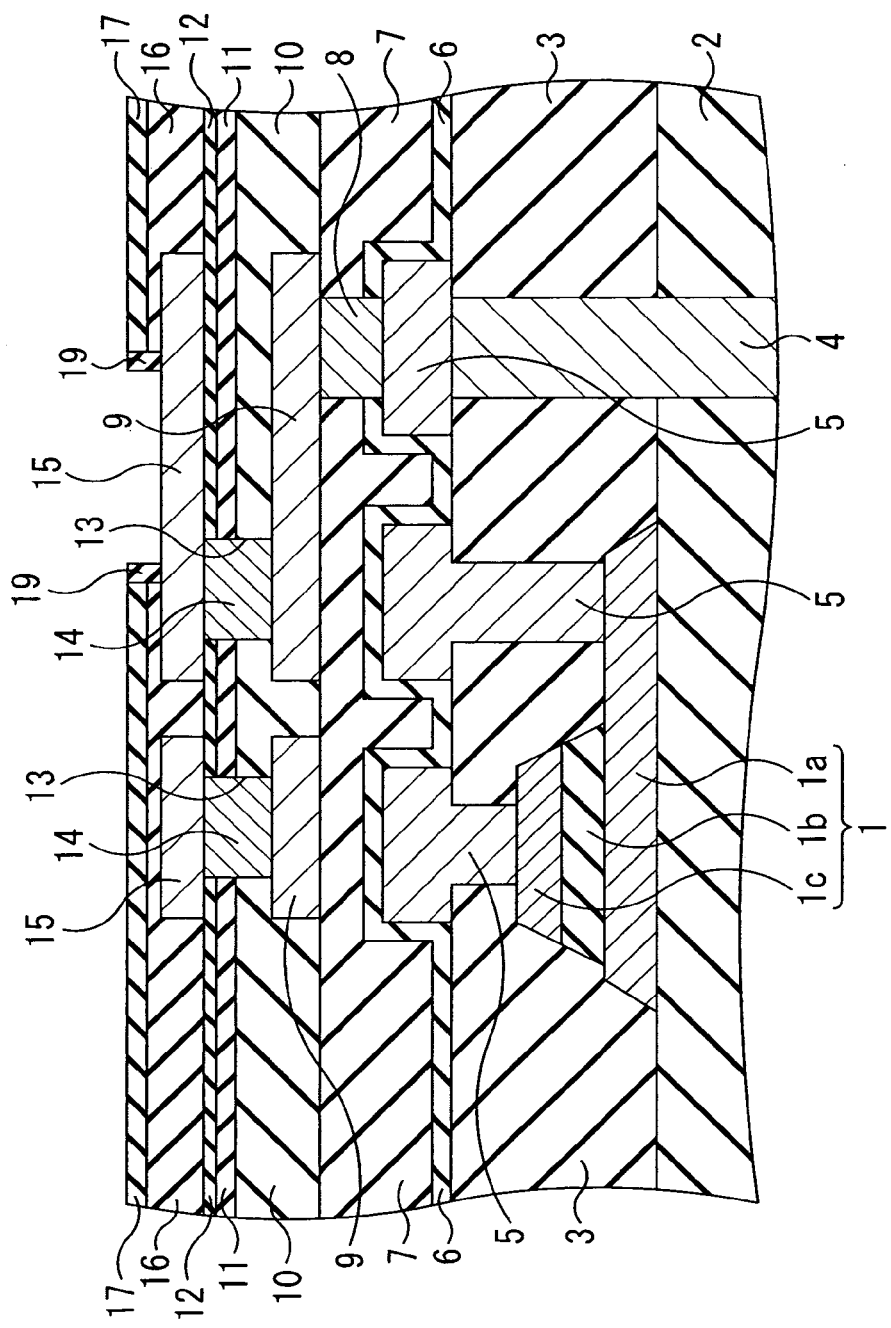
Figure 21:
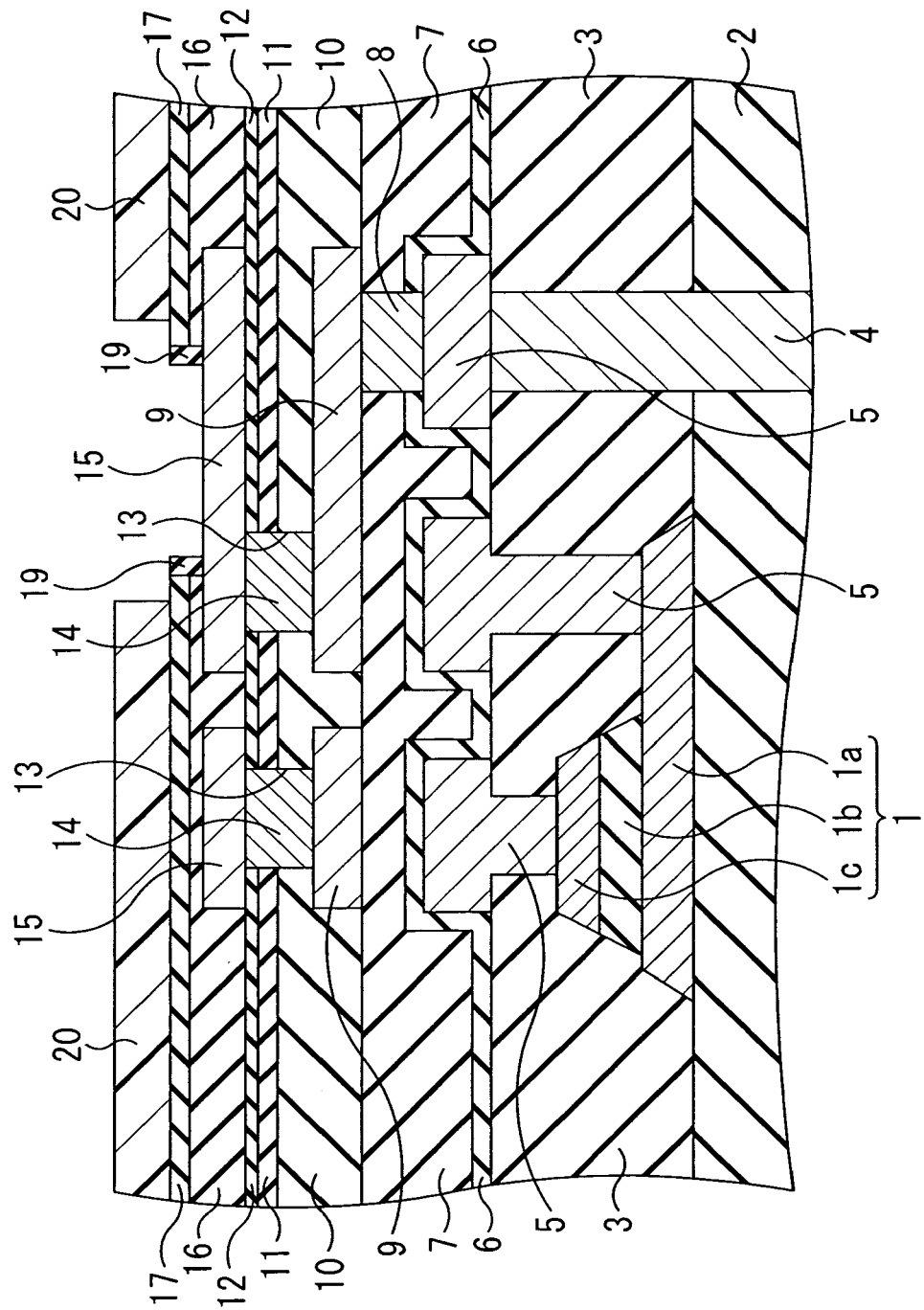

Next, as shown in FIG. 2H, silicon nitride films 19 are formed on the side wall portions in the pad openings 18. The silicon nitride films 19 cover the side portions of the SOG films 16.

Subsequently, as shown in FIG. 2I, a polyimide film 20 is formed on the silicon nitride film 17 in a manner not to cover the pad openings 18.

According to the first embodiment as described above, since the coating-type SOG film 16 is formed on the wirings 15 also serving as a pad, the flatness of the silicon nitride film 17 formed thereon can be made high. As a result, occurrence of cracks in the silicon nitride film 17 can be suppressed. Further, if the SOG film 16 is just formed, diffusion of moisture or the like may occur accompanying the formation of the SOG film 16, whereas the alumina film 11 is formed in this embodiment, so that diffusion of moisture or the like toward the ferroelectric capacitor 1 can be suppressed.

Second Embodiment

Figure 3A:
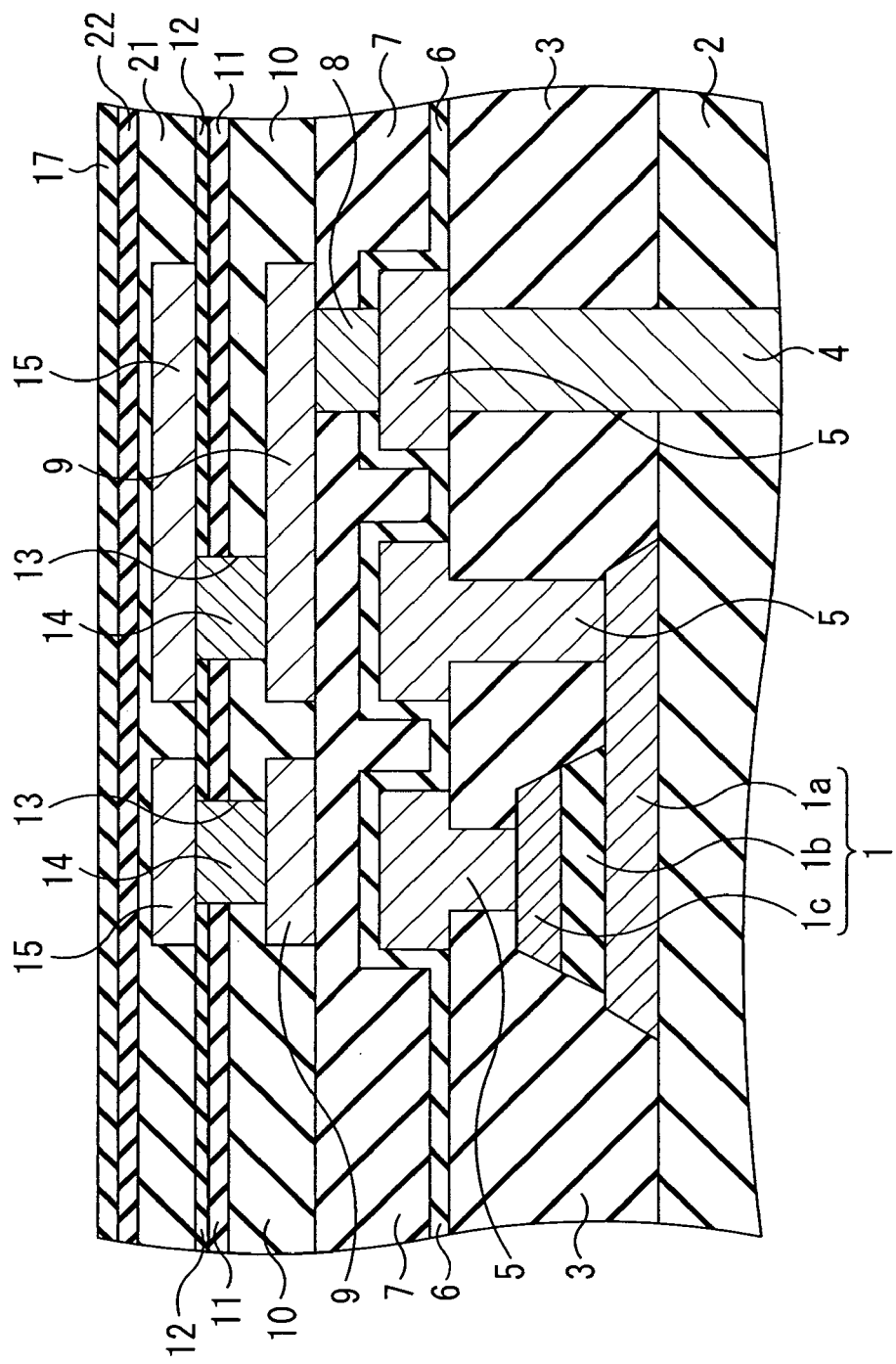
FIGS. 3A and 3B are cross-sectional views showing a method of manufacturing a ferroelectric memory according to a second embodiment of the present invention in the order of steps.
Figure 3B:
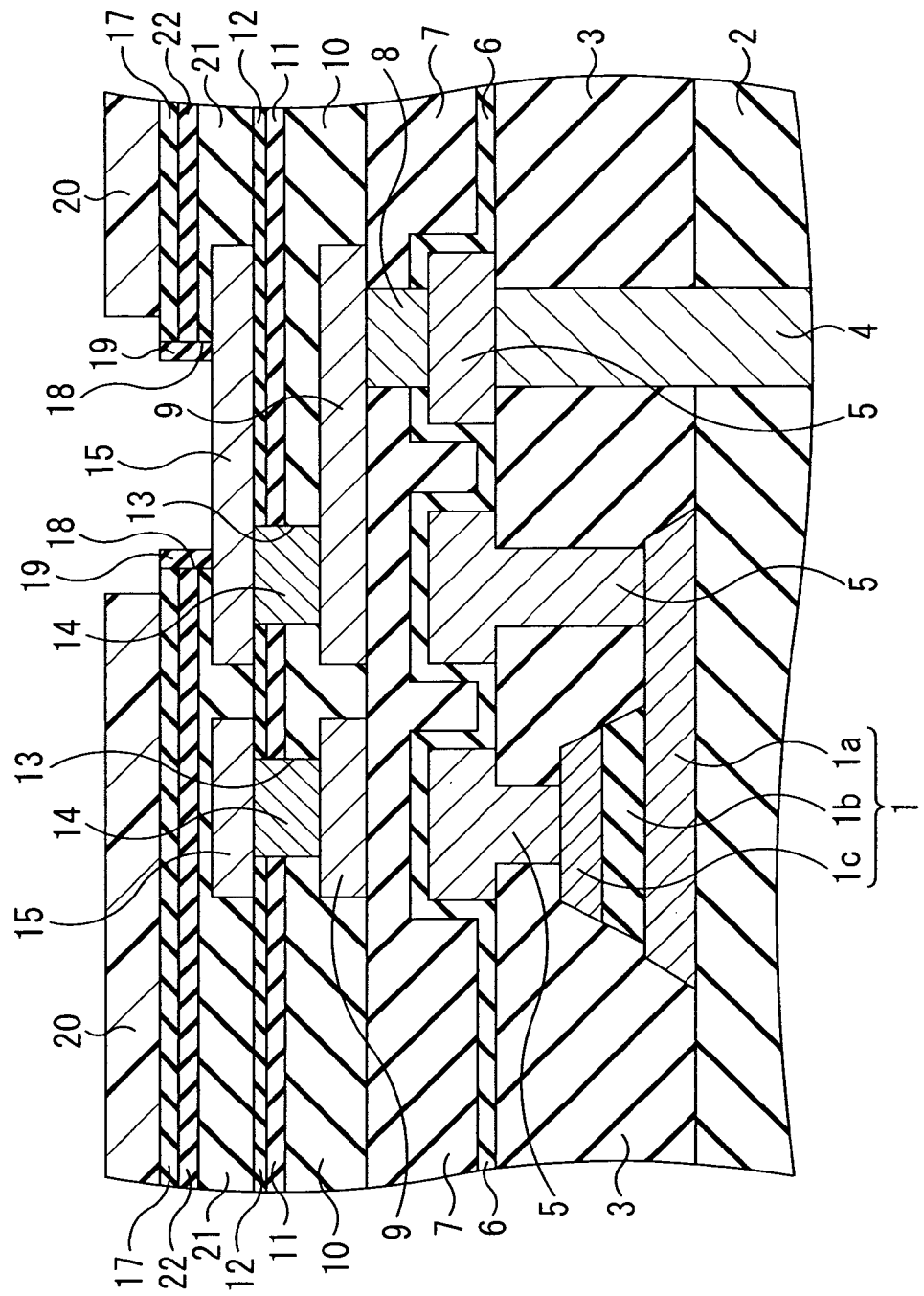

Next, a second embodiment of the present invention will be described. FIG. 3A and FIG. 3B are cross-sectional views showing a method of manufacturing a ferroelectric memory according to the second embodiment of the present invention in the order of steps.

In this embodiment, first, as shown in FIG. 3A, the steps up to the formation of the wirings 15 are performed in the same manner as that in the first embodiment. Next, a TEOS film 21 is formed on the entire surface, for example, by a plasma CVD method. The thickness of the TEOS film 21 is set to, for example, 1300 nm to 2000 nm. Subsequently, the TEOS film 21 is flattened by CMP (Chemical Mechanical Polishing). The thickness of the TEOS film 21 after the flattening is set to, for example, 350 nm to 500 nm from the surface of the wirings 15. Thereafter, plasma processing is performed on the TEOS film 21 in an atmosphere containing N (nitrogen). As a result of this, the surface of the TEOS film 21 is slightly nitrided and thus decreases in hygroscopicity. Subsequently, a silicon oxide film 22 is formed on the TEOS film 21. Then, the silicon nitride film 17 is formed on the silicon oxide film 22. The thickness of the silicon nitride film 17 is set to, for example, 350 nm to 500 nm.

Subsequently, as shown in FIG. 3B, the pad openings 18 are formed. The steps of the formation of the silicon nitride film 19 and thereafter are performed in the same manner as that in the first embodiment.

In the second embodiment as described above, the same effects as those in the first embodiment can be obtained through the TEOS film 21 is formed instead of the SOG film 16.

Third Embodiment

Figure 4A:
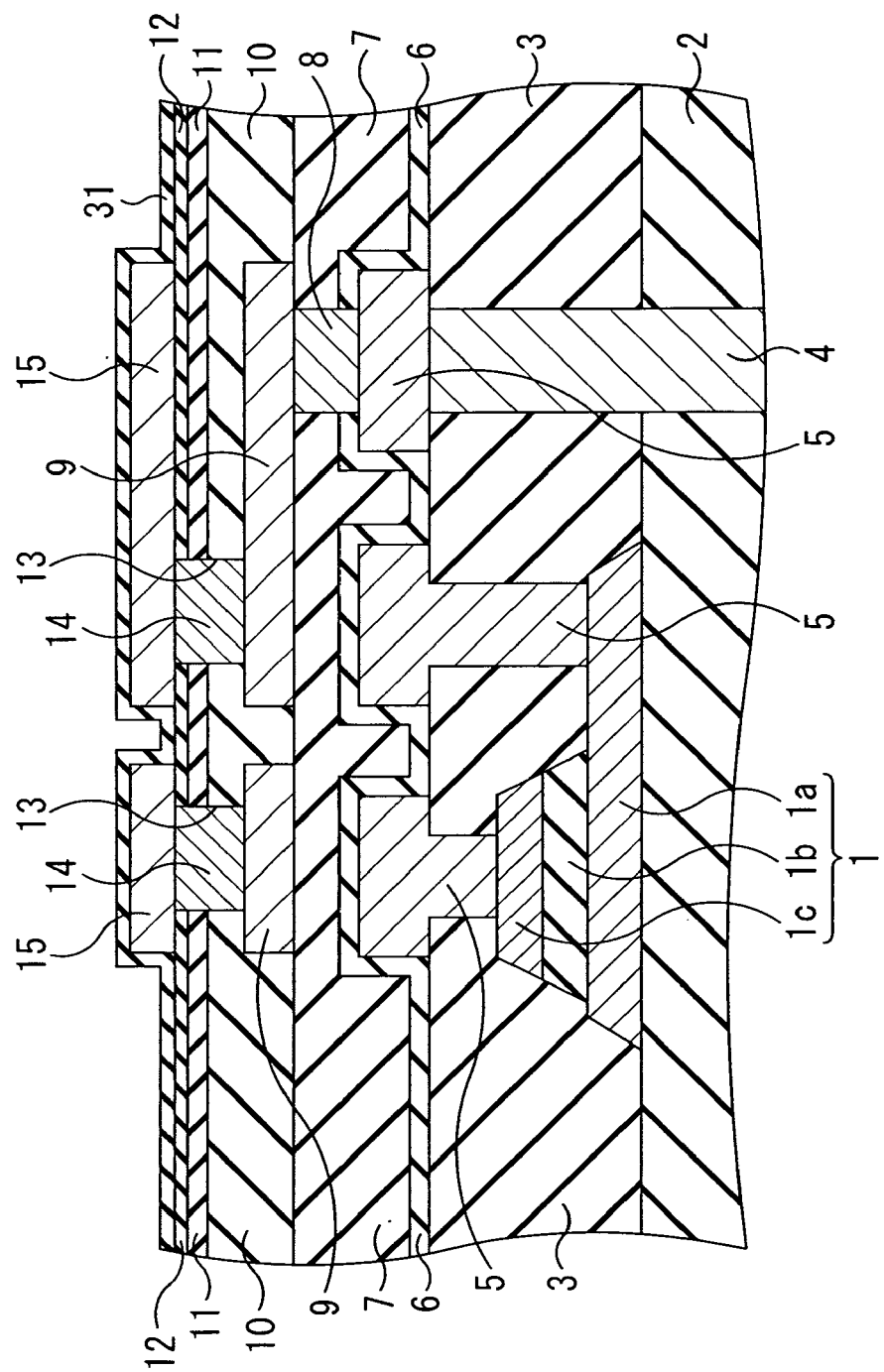
FIGS. 4A and 4B are cross-sectional views showing a method of manufacturing a ferroelectric memory according to a third embodiment of the present invention in the order of steps.
Figure 4B:
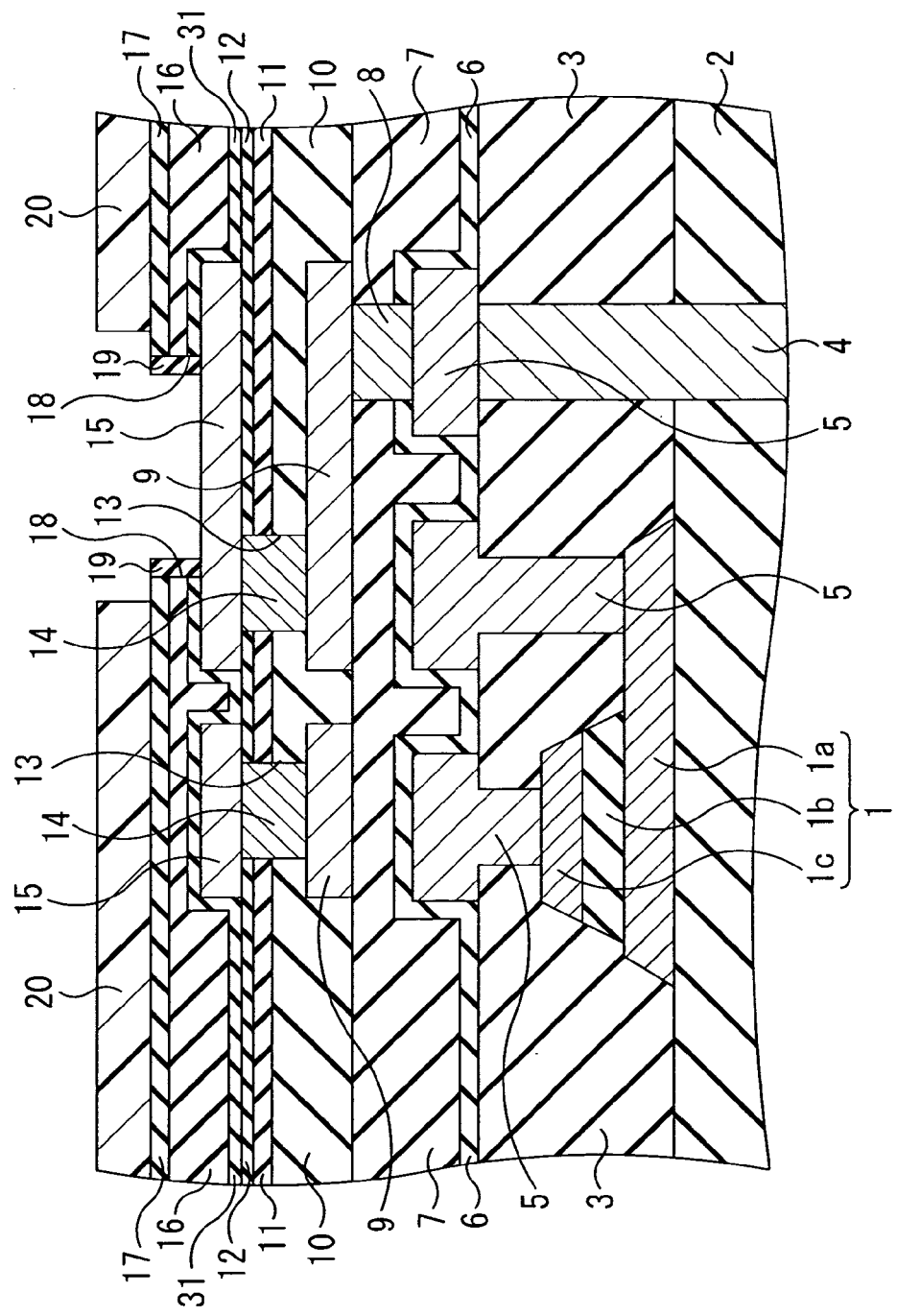

Next, a third embodiment of the present invention will be described. FIG. 4A and FIG. 4B are cross-sectional views showing a method of manufacturing a ferroelectric memory according to the third embodiment of the present invention in the order of steps.

In this embodiment, first, as shown in FIG. 4A, the steps up to the formation of the wirings 15 are performed in the same manner as that in the first embodiment. Next, $N_2$ annealing treatment is performed on the wirings 15. The conditions of the $N_2$ annealing treatment are set to, for example, temperature: 350° C., $N_2$ flow rate: 20 l/min, and time: 30 minutes. Then, an alumina film 31 covering the wirings 15 is formed on the entire surface.

Subsequently, as shown in FIG. 4B, the silicon oxide film 16 is formed. The thickness of the silicon oxide film 16 is set to, for example, about 350 nm. Then, the steps of the formation of the silicon nitride film 17 and thereafter are performed in the same manner as that in the first embodiment.

In the third embodiment as described above, since the alumina film 31 is formed just under the silicon oxide film 16, diffusion of hydrogen and moisture from the outside into the ferroelectric film 1b can be further suppressed. Further, since the annealing treatment has been performed on the wirings 15 in the atmosphere containing nitrogen prior to the formation of the alumina film 31, partial peeling of the alumina film 31 can be suppressed, and entry of hydrogen and moisture accompanying the peeling can also be suppressed.

Fourth Embodiment

Figure 5:
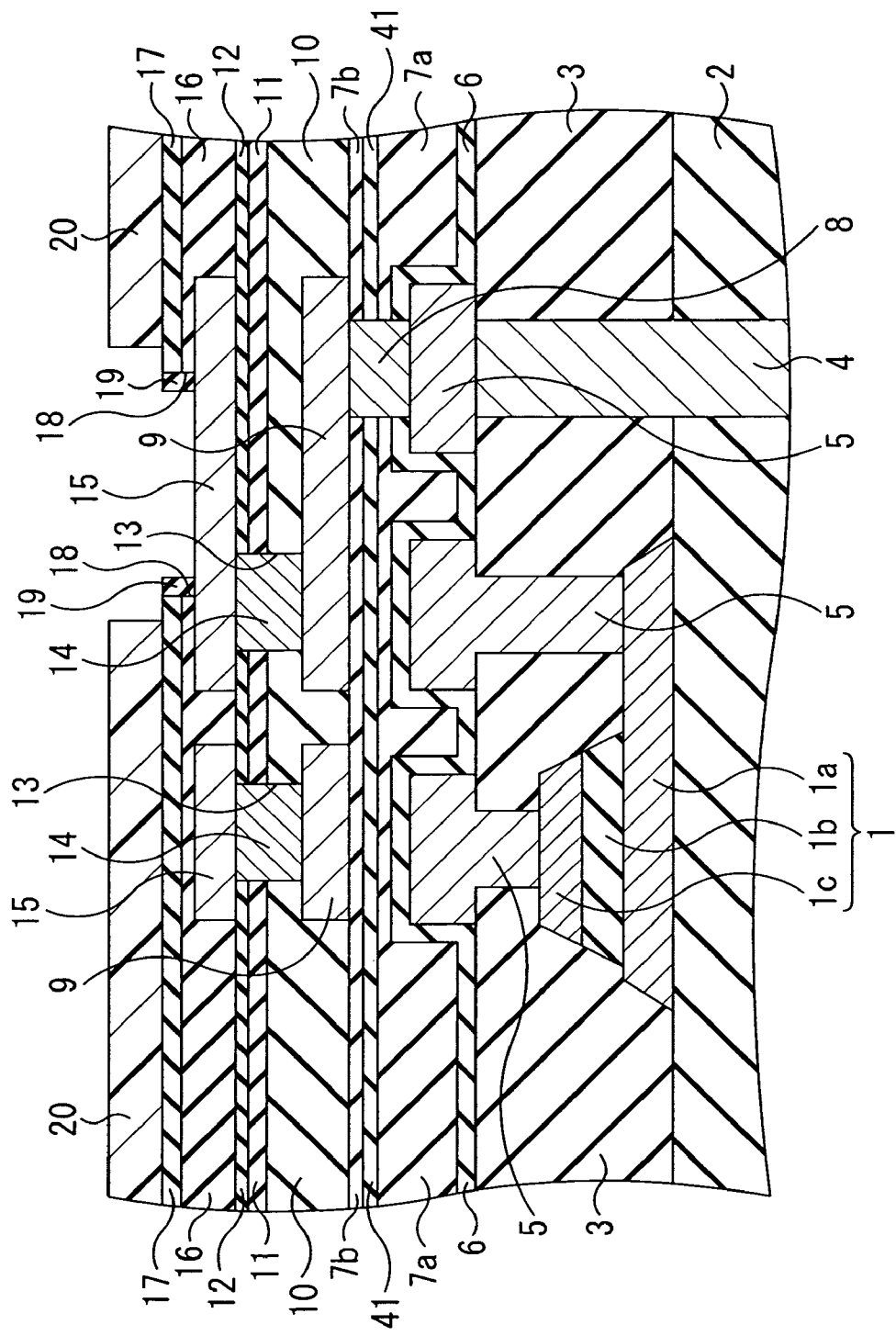
FIG. 5 is a cross-sectional view showing a method of manufacturing a ferroelectric memory according to a fourth embodiment of the present invention.
Figure 6:
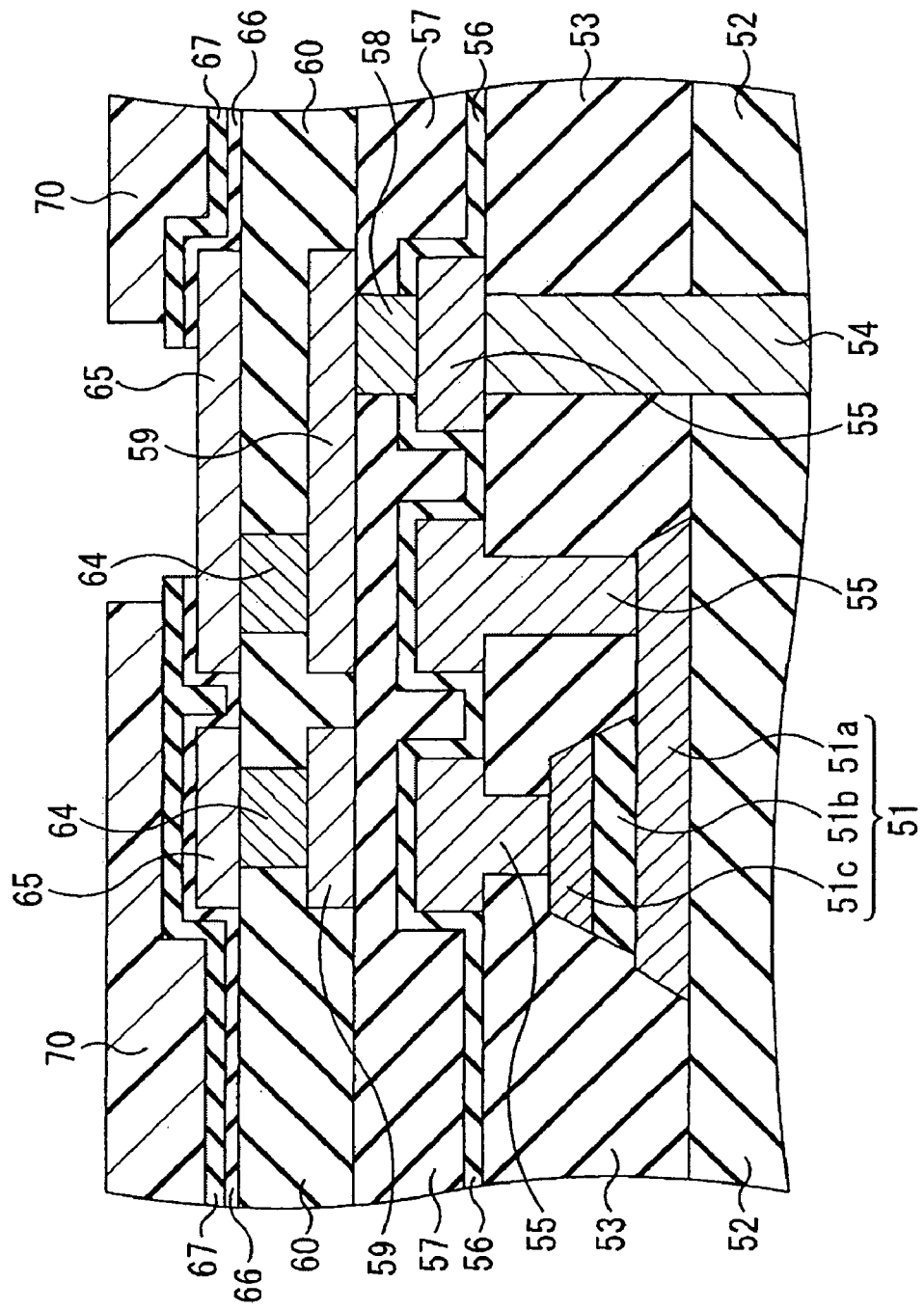
FIG. 6 is a cross-sectional view showing a structure of a conventional ferroelectric memory.

Next, a fourth embodiment of the present invention will be described. FIG. 5 is a cross-sectional view showing a method of manufacturing a ferroelectric memory according to the fourth embodiment of the present invention.

In this embodiment, an alumina film is formed in the interlayer insulation film between the wirings 5, which is located at the lowermost layer of the plurality of wiring layers above the ferroelectric capacitor 1, and the wirings 9 above the wirings 5. In other words, in contrast to the first embodiment, in which the interlayer insulation film 7 is formed, an interlayer insulation film 7a, an alumina film 41, and an interlayer insulation film 7b are formed in sequence as shown in FIG. 5 in this embodiment. Other steps are performed in the same manner as that in the first embodiment.

In the fourth embodiment as described above, the alumina film 41 is formed near the ferroelectric capacitor 1, so that even if moisture or the like enters from the outside, diffusion of the moisture or the like can be suppressed before it reaches the ferroelectric film 1b.

Any two or more of the first to fourth embodiments may be combined.

The formation of the silicon nitride film 19 may be omitted.

Next, results of examinations carried out by the present inventor will be explained.

(First Examination)

In the first examination, ten pieces of each of three kinds of samples were produced, and the status of permeation of aqua regia was observed. Then, after the formation of up to the polyimide film was performed to complete the ferroelectric memory, the samples were immersed in sulfuric acid for about 30 seconds to peel the polyimide film. Then, each sample was immersed in aqua regia for about one minute, and the status of occurrence of permeation was evaluated. The result is shown in the following Table 1 together with conditions. Note that the formation condition and the thickness of the silicon oxide film and the silicon nitride film covering the pad were made different among the three kinds of samples, and the alumina film under the pad was formed only in Example 1.

TABLE 1

| | Thickness of Silicon Oxide Film (nm) | Thickness of Silicon Nitride Film (nm) | Number of occurrences of permeation | Note |
|---|---|---|---|---|
| Example 1 | 350 | 500 | 0/10 | Without Corrosion |
| Comparative Example 1 | 100 | 350 | 8/10 | With Wiring Corrosion |
| Comparative Example 2 | 100 | 500 | 8/10 | With Wiring Corrosion |

Figure 7:
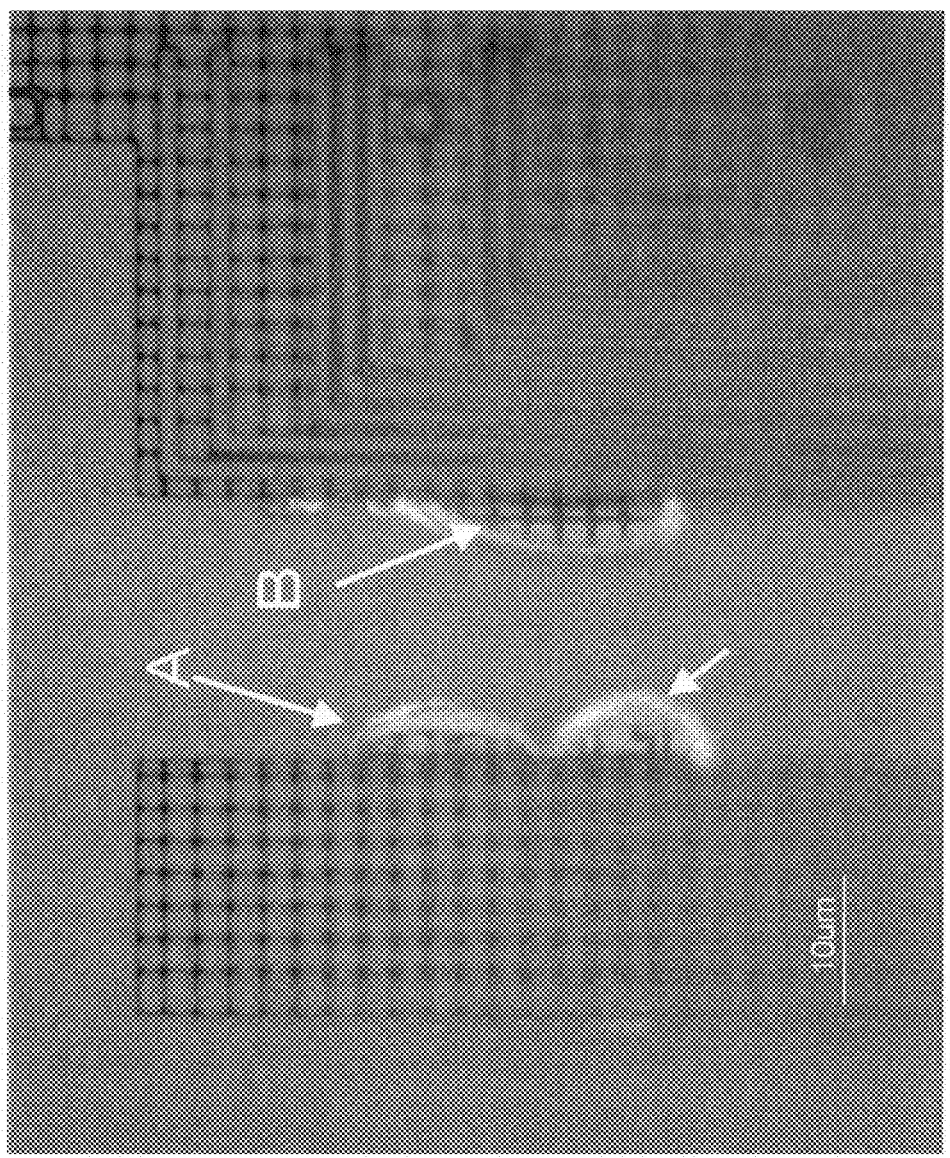
FIG. 7 is an SEM photograph showing corrosion in an Al wiring.
Figure 8:
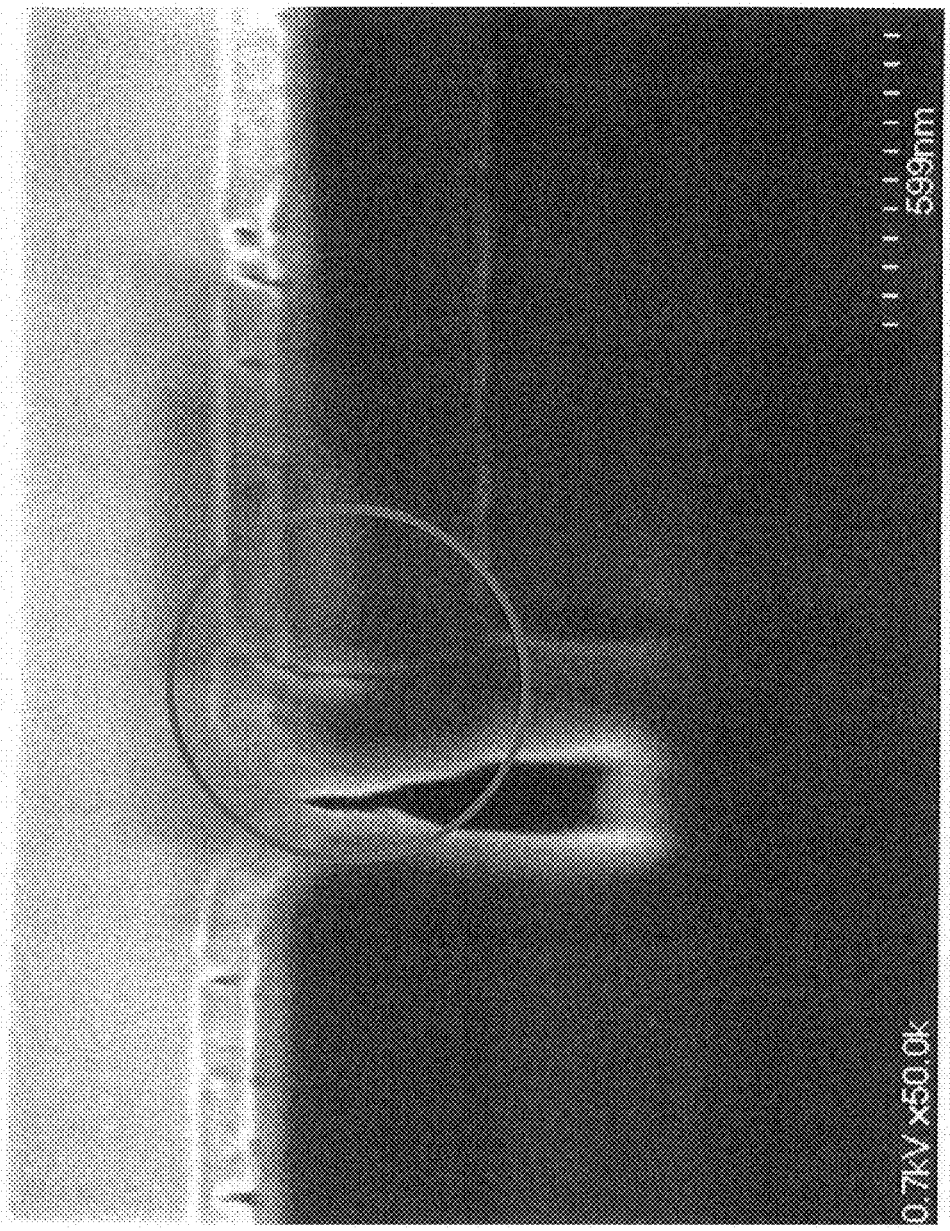
FIG. 8 is an SEM photograph of a portion shown by an arrow A in FIG. 7.
Figure 9:
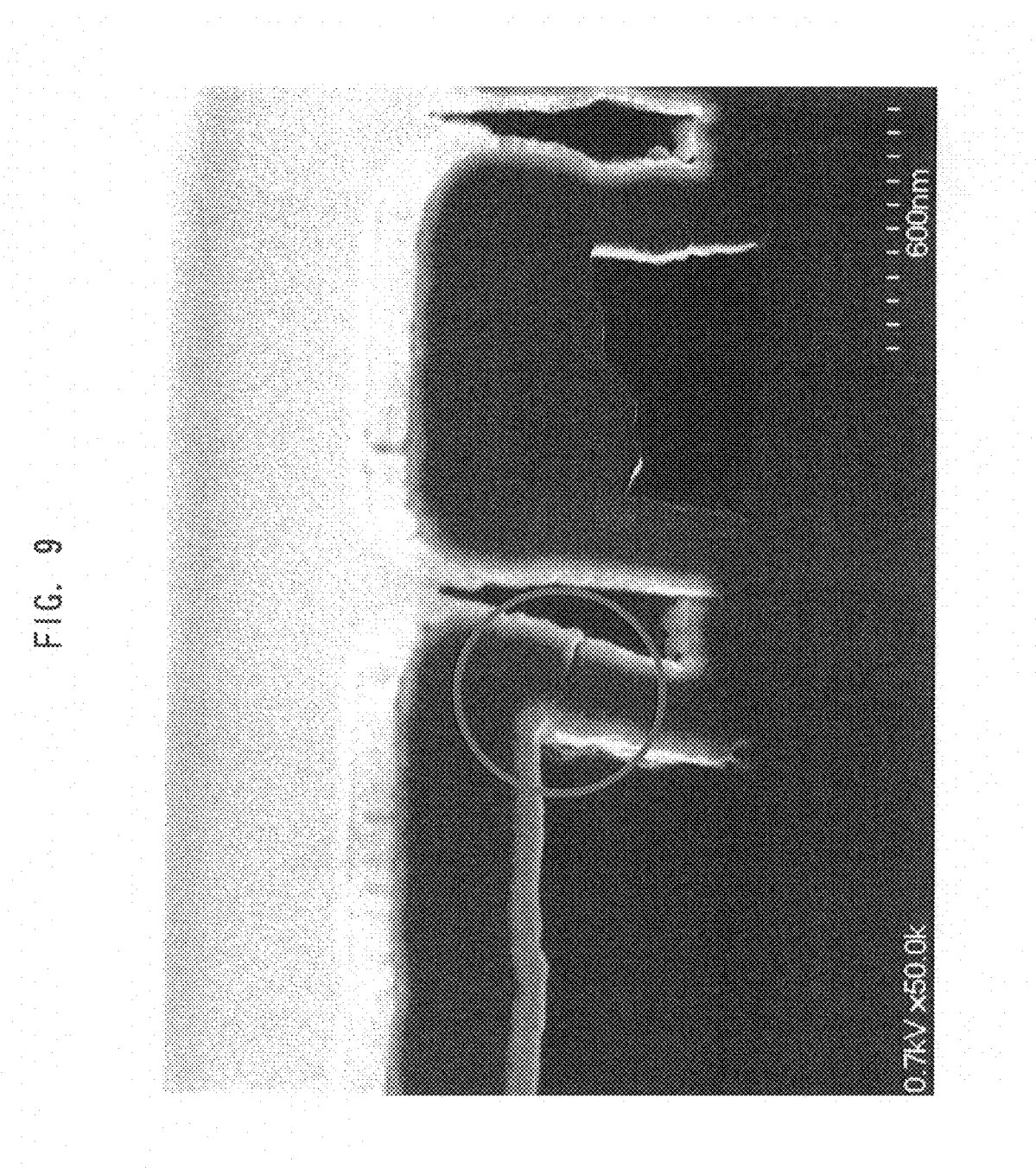
FIG. 9 is an SEM photograph of a portion shown by an arrow B in FIG. 7.

Note that in Example 1, the TEOS film of 1600 nm covering the wiring (pad) was formed as the silicon oxide film and then polished by CMP to have a thickness of 350 nm. In other words, Example 1 is according to the second embodiment. On the other hand, in Comparative Examples 1 and 2, the silicon oxide film of 100 nm was formed using TEOS. Furthermore, the sample of Comparative Example 1 was immersed in sulfuric acid and observed with an SEM (Scanning Electron Microscope), it was found that, as shown in FIG. 7, there were corroded portions (portions shown by arrows) in an Al wiring. Further, the present inventor took an SEM photograph of the portions shown by arrows A and B in FIG. 7. FIG. 8 is an SEM photograph of the portion shown by the arrow A in FIG. 7, and FIG. 9 is an SEM photograph of the portion shown by the arrow B in FIG. 7. As shown in FIG. 8 and FIG. 9, cracks occurred in the silicon nitride film (within the regions surrounded by circles).

(Second Examination)

In the second examination, twenty pieces of each of two kinds of samples were produced, and the PTHS resistance was evaluated. Example 2 is according to the second embodiment, and Comparative Example 3 corresponds to one made by omitting the alumina film under the pad from the second embodiment.

TABLE 2

|  | Number of Defects after 72 Hours | Number of Defects after 168 Hours | Number of Defects after 336 Hours |
|---|---|---|---|
| Example 2 | 0/20 | 0/20 | 0/20 |
| Comparative Example 3 | 12/19 | 11/20 | Not Counted |

INDUSTRIAL APPLICABILITY

As has been describe above in detail, according to the present invention, since the alumina film is formed between two wiring layers located at the uppermost portion, adverse effects from the upper layer and the outside on the ferroelectric capacitor can be suppressed. For example, entry of moisture from the outside can be suppressed. Further, even if a cover film covering the wiring layer located at the uppermost portion is formed using a material susceptible to diffusion of moisture, the diffusion to the ferroelectric capacitor can be suppressed. Accordingly, it is possible to form a film, as the cover film, even from a material which can provide high flatness but is susceptible to diffusion of moisture and which has not been used conventionally. Therefore, it is also possible to suppress occurrence of cracks in the cover film.

What is claimed is:

1. A semiconductor device, comprising:
a ferroelectric capacitor;
a plurality of wiring layers formed above said ferroelectric capacitor;
a first wiring layer formed above the ferroelectric capacitor, wherein the first wiring layer is included in the plurality of wiring layers;
a substantially flat alumina film formed above the first wiring layer; and
a second wiring layer formed above the substantially flat alumina film, wherein the second wiring layer is included in the plurality of wiring layers and is positioned at an uppermost portion of the plurality of wiring layers,
wherein the second wiring layer is electrically coupled to a transistor via a conductive plug, and
wherein whole of the second wiring layer is positioned above whole of the substantially flat alumina film.

2. The semiconductor device according to claim 1, further comprising:
a silicon oxide film covering the second wiring layer; and
a silicon nitride film formed on said silicon oxide film.

3. The semiconductor device according to claim 2, wherein a pad opening exposing a portion of the second wiring layer is formed in said silicon oxide film and said silicon nitride film.

4. The semiconductor device according to claim 3, further comprising a second silicon nitride film covering an end portion of said silicon oxide film on a side wall portion of said pad opening.

5. The semiconductor device according to claim 2, wherein said silicon oxide film is an SOG film.

6. The semiconductor device according to claim 2, wherein said silicon oxide film is a TEOS film after flattening processing.

7. The semiconductor device according to claim 2, further comprising a second alumina film directly covering the second wiring film and formed under said silicon oxide film.

8. The semiconductor device according to claim 1, further comprising a third alumina film formed between the first wiring layer and said ferroelectric capacitor.

9. The semiconductor device according to claim 1, wherein said ferroelectric capacitor has a ferroelectric film containing Pb, Zr, Ti and O.

* * * * *